US010755771B2

(12) United States Patent
Khellah et al.

(10) Patent No.: US 10,755,771 B2
(45) Date of Patent: Aug. 25, 2020

(54) TECHNIQUES FOR MULTI-READ AND MULTI-WRITE OF MEMORY CIRCUIT

(71) Applicant: Intel Corporation, Santa Clara, CA (US)

(72) Inventors: Muhammad M. Khellah, Tigard, OR (US); Somnath Paul, Hillsboro, OR (US); Charles Augustine, Portland, OR (US); Turbo Majumder, Portland, OR (US); Suyoung Bang, Hillsboro, OR (US)

(73) Assignee: Intel Corporation, Santa Clara, CA (US)

(*) Notice: Subject to any disclaimer, the term of this patent is extended or adjusted under 35 U.S.C. 154(b) by 15 days.

(21) Appl. No.: 16/226,385

(22) Filed: Dec. 19, 2018

(65) Prior Publication Data
US 2019/0198093 A1 Jun. 27, 2019

(51) Int. Cl.
G11C 11/00 (2006.01)
G11C 13/00 (2006.01)
(Continued)

(52) U.S. Cl.
CPC .......... *G11C 11/419* (2013.01); *G11C 7/103* (2013.01); *G11C 7/1012* (2013.01);
(Continued)

(58) Field of Classification Search
CPC ..... G11C 11/419; G11C 11/1675; G11C 7/12; G11C 11/1657; G11C 11/1673; G11C 11/4085; G11C 11/4087; G11C 11/4096; G11C 5/063; G11C 11/4091; G11C 11/406; G11C 7/10
See application file for complete search history.

(56) References Cited

U.S. PATENT DOCUMENTS 4,636,987 A 1/1987 Norwood et al.
6,198,682 B1 3/2001 Proebsting
(Continued)

OTHER PUBLICATIONS

Arun Subramaniyan et al., "Cache Automaton," Proceedings of the 50th Annual IEEE/ACM International Symposium on Microarchitecture, Oct. 14-18, 2017, 14 pages.
(Continued)

*Primary Examiner* — Hien N Nguyen
(74) *Attorney, Agent, or Firm* — Schwabe, Williamson & Wyatt, P.C.

(57) ABSTRACT

Embodiments include apparatuses, methods, and systems to implement a multi-read and/or multi-write process with a set of memory cells. The set of memory cells may be multiplexed with a same sense amplifier. As part of a multi-read process, a memory controller coupled to a memory circuit may precharge the bit lines associated with the set of memory cells, provide a single assertion of a word line signal on the word line, and then sequentially read data from the set of memory cells (using the sense amplifier) based on the precharge and the single assertion of the word line signal. Additionally, or alternatively, a multi-write process may be performed to sequentially write data to the set of memory cells based on one precharge of the associated bit lines. Other embodiments may be described and claimed.

22 Claims, 14 Drawing Sheets

(51) Int. Cl.
    *G11C 11/419* (2006.01)
    *G11C 11/412* (2006.01)
    *G11C 7/12* (2006.01)
    *G11C 7/10* (2006.01)
    *G11C 11/418* (2006.01)
    *G11C 7/22* (2006.01)

(52) U.S. Cl.
    CPC .............. *G11C 7/1051* (2013.01); *G11C 7/12* (2013.01); *G11C 11/412* (2013.01); *G11C 11/418* (2013.01); *G11C 7/222* (2013.01)

(56) References Cited

U.S. PATENT DOCUMENTS

| | | | |
|---|---|---|---|
| 9,373,395 B1* | 6/2016 | Augustine | G11C 13/004 |
| 10,269,411 B2* | 4/2019 | Vogelsang | G06F 12/00 |
| 2003/0202406 A1 | 10/2003 | Issa | |
| 2008/0112209 A1 | 5/2008 | Cho et al. | |
| 2008/0239847 A1* | 10/2008 | Jung | G11C 7/1048 365/203 |
| 2012/0117306 A1* | 5/2012 | Ahmed | G06F 3/0625 711/103 |
| 2013/0258761 A1 | 10/2013 | Sharpe-Geisler et al. | |
| 2015/0085566 A1* | 3/2015 | Jain | G11C 8/08 365/154 |
| 2016/0092293 A1* | 3/2016 | Ishii | G06F 11/0751 714/819 |
| 2019/0325919 A1* | 10/2019 | Bhargava | G11C 14/009 |
| 2019/0325961 A1* | 10/2019 | Jaiswal | G11C 11/1655 |
| 2020/0075090 A1* | 3/2020 | Kumar | G11C 11/419 |

OTHER PUBLICATIONS

International Search Report and Written Opinion dated Mar. 9, 2020 for International Application No. PCT/US2019/061865, 9 pages.

* cited by examiner

TECHNIQUES FOR MULTI-READ AND MULTI-WRITE OF MEMORY CIRCUIT

FIELD

Embodiments of the present invention relate generally to the technical field of electronic circuits, and more particularly to techniques for multi-read and multi-write of memory circuits.

BACKGROUND

The background description provided herein is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure. Unless otherwise indicated herein, the approaches described in this section are not prior art to the claims in the present disclosure and are not admitted to be prior art by inclusion in this section.

Many electronic circuits, such as processors, include on-die memory circuit, such as static random access memory (SRAM). For many applications, such as machine learning, deep learning, and graphics, the memory bandwidth may be a bottleneck for overall system performance.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example and not by way of limitation in the figures of the accompanying drawings.

DETAILED DESCRIPTION

Figure 1:
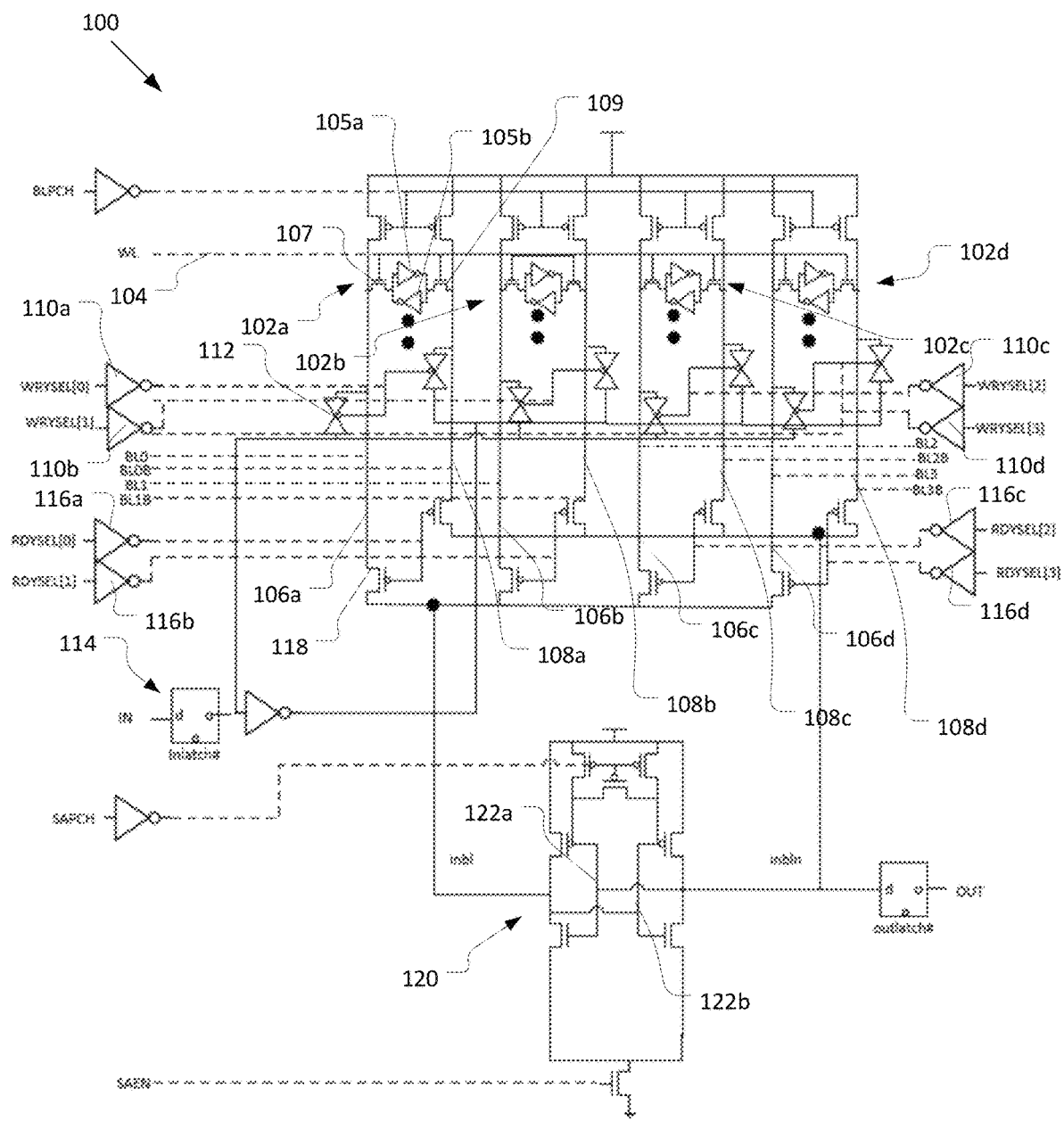
FIG. 1 illustrates a memory circuit with a coupled sense amplifier arrangement, in accordance with various embodiments.

In the following detailed description, reference is made to the accompanying drawings that form a part hereof wherein like numerals designate like parts throughout, and in which is shown by way of illustration embodiments that may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

Various operations may be described as multiple discrete actions or operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order than the described embodiment. Various additional operations may be performed and/or described operations may be omitted in additional embodiments.

The terms "substantially," "close," "approximately," "near," and "about," generally refer to being within +/−10% of a target value. Unless otherwise specified the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

For the purposes of the present disclosure, the phrases "A and/or B" and "A or B" mean (A), (B), or (A and B). For the purposes of the present disclosure, the phrase "A, B, and/or C" means (A), (B), (C), (A and B), (A and C), (B and C), or (A, B, and C).

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

As used herein, the term "circuitry" may refer to, be part of, or include an Application Specific Integrated Circuit (ASIC), an electronic circuit, a processor (shared, dedicated, or group), a combinational logic circuit, and/or other suitable hardware components that provide the described functionality. As used herein, "computer-implemented method"

may refer to any method executed by one or more processors, a computer system having one or more processors, a mobile device such as a smartphone (which may include one or more processors), a tablet, a laptop computer, a set-top box, a gaming console, and so forth.

Various embodiments may describe a circuit to implement a multi-read and/or multi-write process with a set of memory cells. The circuit may include a memory circuit including a set of memory cells multiplexed with a sense amplifier. The set of memory cells may be coupled to a same word line and/or a same bit line precharge line. As part of a multi-read process, a memory controller coupled to the memory circuit may precharge the bit lines associated with the set of memory cells, provide a single assertion of a word line signal on the word line, and then sequentially read data from the set of memory cells (using the sense amplifier) based on the precharge and the single assertion of the word line signal. Accordingly, multiple memory cells may be read sequentially with only one precharge operation and one assertion of the word line signal. The multi-read operation may enable higher read throughput (e.g., more bits to be read per time interval) and/or lower power consumption compared with prior read techniques.

The multi-read operation may be used, for example, when the address pattern of sequential reads is known. For example, the multi-read operation may be used to read consecutive elements of a matrix, such as for image processing, deep neural networks, and/or scientific computing.

Additionally, or alternatively, a multi-write process may be performed to sequentially write data to the set of memory cells based on one precharge of the associated bit lines. For example, to implement the multi-write process, the memory controller may precharge the bit lines using the bit line precharge line. The memory controller may assert, after the precharge, the word line signal on the word line for a time period. Additionally, the memory controller may write data sequentially to the set of memory cells during the time period while the word line signal is asserted. The multi-write process may provide greater write throughput and/or reduce power consumption compared with prior write techniques.

FIG. 1 illustrates a memory circuit 100 in accordance with various embodiments. Memory circuit 100 may include an array of memory cells 102a-d arranged in rows and columns. The memory cells 102a-d shown in FIG. 1 are in different columns (e.g., in the same row). It will be apparent that the array may include additional memory cells in the same column (e.g., additional rows of memory cells). Each memory cell 102a-d may be coupled to a word line (WL) 104 and a bit line 106a-d. In some embodiments, the memory cells 102a-d may be further coupled to a bit bar line 108a-d. Memory cells 102a-d of the same row may be coupled to the same word line 104, and memory cells 102a-d of the same column may be coupled to the same bit line 106a-d and/or bit bar line 108a-d. The bit lines 106a-d and/or bit bar lines 108a-d may be coupled to the same bit line precharge line to be precharged responsive to the same bit line precharge signal BLPCH (e.g., by respective bit line precharge circuitry).

In various embodiments, the memory circuit 100 may be a static random access memory (SRAM) or another suitable type of memory. Additionally, or alternatively, in some embodiments, the memory circuit 100 may be on a same die as a processor that is coupled to the memory. In other embodiments, the memory circuit 100 may be on a separate die from a processor that is coupled to the memory.

The memory cells 102a-d shown in FIG. 1 are six transistor (6 T) memory cells. For example, the memory cell 102a may include a pair of cross-coupled inverters 105a-b (which may each include two transistors) coupled between two internal nodes. The memory cell 102a may further include a transistor 107 coupled between the first internal node and the bit line 106a and having a gate terminal coupled to the word line 104. The memory cell 102a may further include another transistor 109 coupled between the second internal node and the bit bar line 108a, and having a gate terminal coupled to the word line 104. The other memory cells 102b-d of the memory array may include similar structure to the memory cell 102a. It will be apparent that other embodiments may include another suitable design and/or type of memory cell.

In various embodiments, the memory circuit 100 may include a sense amplifier 120 that is multiplexed with multiple columns of memory cells 102a-d to selectively read data from memory cells 102a-d of each column. For example, memory circuit 100 shows four columns of memory cells 102a-d multiplexed with one sense amplifier 100. It will be apparent that other embodiments may include a different number of columns multiplexed to one sense amplifier. For example, in some embodiments, 2 to 8 columns of memory cells may be multiplexed to one sense amplifier coupled with the same word lines and/or bit line precharge lines. Additionally, or alternatively, as discussed further with respect to FIGS. 5 and 6, in some embodiments the memory circuit 100 may include multiple blocks of memory cells (e.g., left and right blocks, each with separate word lines and/or bit line precharge lines), and the same sense amplifier 100 may be used to read data from memory cells of multiple blocks.

The memory circuit 100 may further include write column select circuitry to provide respective write column select signals (e.g., WRYSEL[0], WRYSEL[1], WRYSEL[2], and WRYSEL[3]) to select one of the columns of the memory array to which to write data during a write operation. The word line signal on the word lines (e.g., word line 104) may select the row to which to write data. Accordingly, the write column select signal and word line signal may combine to select one of the memory cells 102a-d. Write select circuitry is shown in FIG. 1 to include inverters 110a-d and transmission gates 112. In some embodiments, the transmission gates 112 may be implemented by one or more transistors. The inverters 110a-d may receive respective write column select signals (e.g., WRYSEL[0], WRYSEL[1], WRYSEL[2], and WRYSEL[3]). As discussed above, other embodiments may include a different number of columns multiplexed with the same sense amplifier, such as 2 to 8 columns. The output of the inverters is coupled to the pair of transmission gates 112 between the respective bit line and bit bar line (e.g., the transmission gates 112 coupled to the bit line 106a and bit bar line 108a, respectively). The input of the transmission gates 112 receives data to be written to the selected memory cell 102a-d (e.g., via input data circuitry 114). When one of the write select signals goes to the write logic level (e.g., logic high), the associated transmission gates 112 may be turned on, thus passing the data to the respective bit line (and an inverted version of the data to the respective bit bar line). It will be apparent that other embodiments may include other designs and/or configurations of the write column select circuitry and/or input data circuitry 114.

The memory circuit 100 may further include read column select circuitry to select one of the columns of the memory array from which to read data during a read operation. The word line signal on the word lines (e.g., word line 104) may select the row from which to read data during the read operation. The read column select circuitry is shown in FIG. 1 to include inverters 116a-d and transistors 118 (which may alternatively be modeled as transmission gates). The inverters 116a-d may receive respective read select signals (e.g., RDYSEL[0], RDYSEL[1], RDYSEL[2], and RDYSEL[3]). As discussed above, other embodiments may include a different number of columns multiplexed with the same sense amplifier, such as 2 to 8 columns. The output of the inverters is coupled to the gate terminals of the pair of transistors 118 that are coupled to the respective bit line and bit bar line. The transistors 118 may be coupled between the respective bit line 106a-d or bit bar line 108a-d and a sense amplifier 120. During the read operation, the transistors for the selected column may be turned on, thereby passing the bit line signal and bit bar line signal to the respective differential input of the sense amplifier 120. It will be apparent that other embodiments may include other designs and/or configurations of the read select circuitry and/or sense amplifier 120.

The memory circuit 100 depicted in FIG. 1 includes a "coupled" sense amplifier arrangement, in which the internal sense nodes 122a-b of the sense amplifier 120 are directly coupled to receive the bit line signal and bit bar line signal that are passed to the sense amplifier 120 from the read select circuitry. That is, the input terminals of the sense amplifier 120 are also the output terminals.

Figure 2:
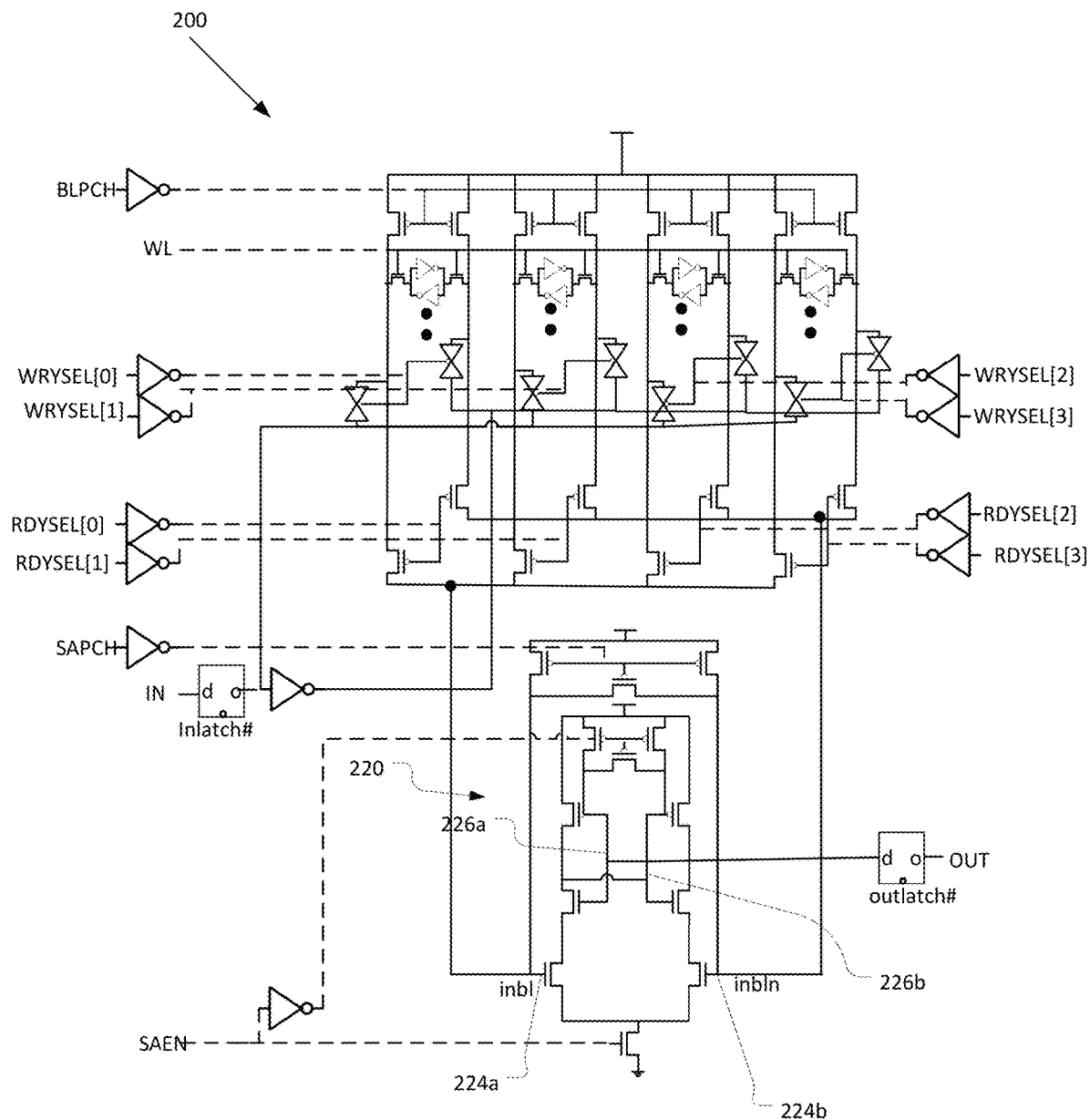
FIG. 2 illustrates a memory circuit with a decoupled sense amplifier arrangement, in accordance with various embodiments.

FIG. 2 illustrates another embodiment of a memory circuit 200 that includes a "decoupled" sense amplifier arrangement. The memory circuit 200 is similar to the memory circuit 100 of FIG. 1, except that the sense amplifier 220 includes input terminals 224a-b that are separate from the output terminals 226a-b. The sense amplifier 220 includes additional input circuitry that is not included in the sense amplifier 120.

Referring again to FIG. 1, the memory circuit 100 may additionally receive a bit line precharge signal BLPCH, a sense amplifier precharge signal SAPCH, and a sense amplifier enable signal SAEN. These signals will be described further below.

In various embodiments, a memory controller may be coupled to the memory circuit 100 to provide various signals to the memory circuit 100 to operate the memory circuit 100 (e.g., perform the write operation and/or read operation). For example, the memory controller may generate and/or provide the write column select signals WRYSEL[0]-[3], the read column select signals RDYSEL[0]-[3], the word line signal WL, the bit line precharge signal BLPCH, the sense amplifier precharge signal SAPCH, and/or the sense amplifier enable signal SAEN.

In various embodiments, the memory controller may perform a multi-read process and/or a multi-read process, as described herein.

Figure 3:
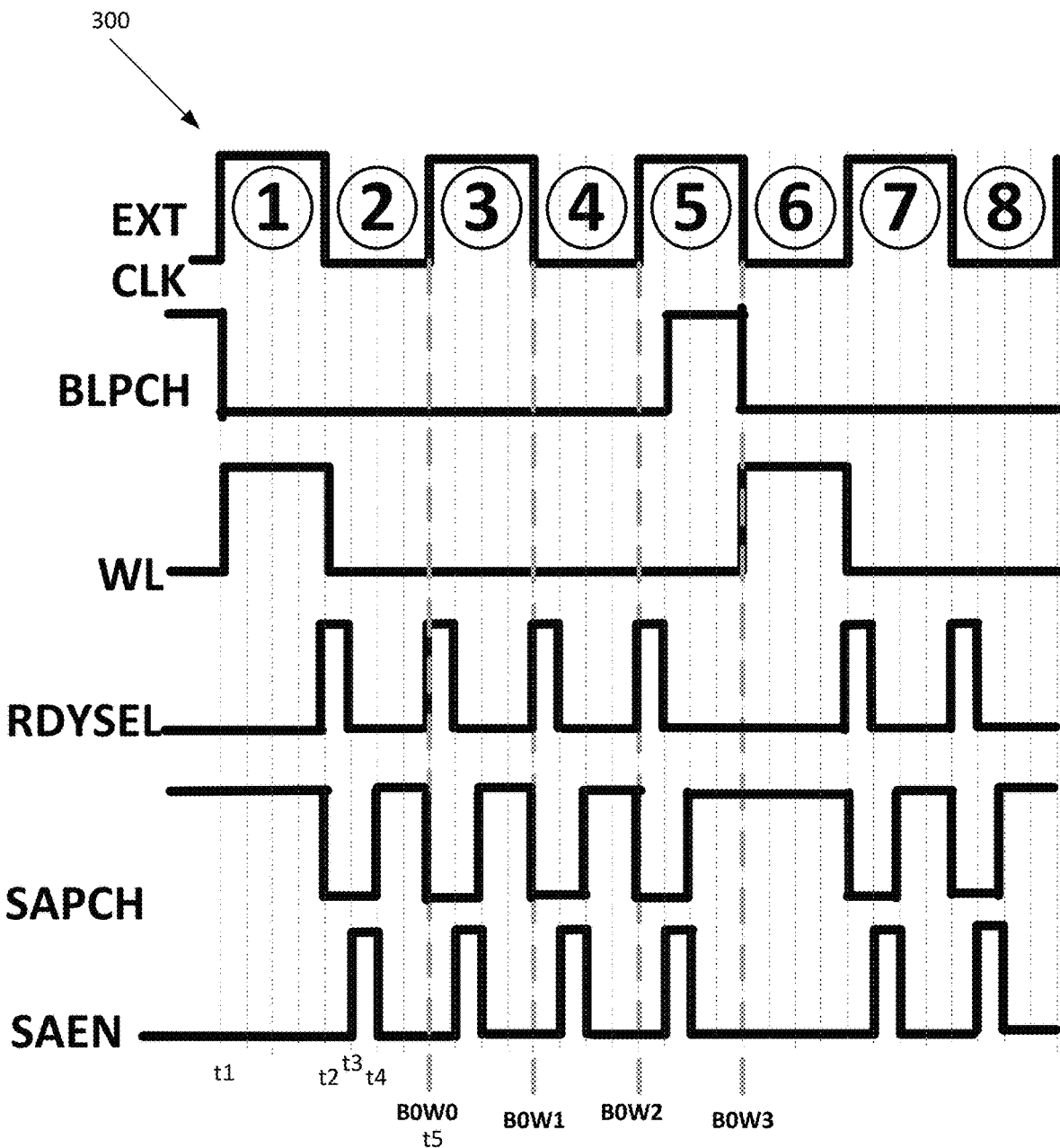
FIG. 3 illustrates example waveforms for a multi-read process performed with a memory circuit having a coupled sense amplifier arrangement, in accordance with various embodiments.

FIG. 3 illustrates example waveforms 300 that may be provided by the memory controller to the memory circuit for a multi-read process, in accordance with various embodiments. The waveforms 300 shown in FIG. 3 may be used for a memory circuit that uses a coupled sense amplifier arrangement, such as memory circuit 100. Accordingly, the multi-read process implemented by the waveforms 300 will be described with respect to memory circuit 100.

The waveforms 300 may include read column select signals RDYSEL[0]-[3], the word line signal WL, the bit line precharge signal BLPCH, the sense amplifier precharge signal SAPCH, and/or the sense amplifier enable signal SAEN. The read column select signals RYDSEL shown in FIG. 1 may be a composite of the multiple one-shot read column select signals RDYSEL[0]-[3] of FIG. 1 (e.g., sequentially illustrating the one-shot pulses of read column select signals RDYSEL[0]-[3]). The timing of waveforms 300 is shown with respect to a clock signal CLK. The duration of the read column select signal RYDSEL, sense amplifier precharge signal SAPCH, and/or sense amplifier enable signal SAEN may be shorter than the corresponding signals in prior read operations (e.g., by half). Furthermore, the RYDSEL, SAPCH, and SAEN signals may be self-timed to perform the successive read operations. The multi-read process implemented by the waveforms 300 may enable 4 memory cells (e.g., memory cells 102a-d) that are coupled to the same sense amplifier to be read within 2.5 full clock cycles (5 clock phases, as labeled in FIG. 3). In some embodiments, the multi-read process may be modified, as discussed further below with respect to FIG. 6, to enable 8 memory cells to be read in 8 clock phases (4 full clock cycles).

Prior to the first half clock cycle, the bit line precharge signal is asserted to logic high to pre-charge the bit lines 106a-d and bit bar lines 108a-d (e.g., to increase the voltage of the bit lines 106a-d and bit bar lines 108a-d). At time t1 (e.g., responsive to a transition of the clock signal), the word line signal WL on word line 104 is asserted (e.g., transitions from logic low to logic high). The bit line precharge signal may also be de-asserted (e.g., transitioned back to logic low) at or before the time t1 to stop the precharge operation.

At time t2 after t1, the read column select signal for the first column (e.g., RDYSEL[0]) may be asserted (e.g., may transition from logic low to logic high). The read column select signal RDYSEL[0] may remain asserted (e.g., at logic high) for a time period that is less than one phase (half cycle) of the clock signal CLK (e.g., ¼ or ⅛ of a clock cycle). In some embodiments, the read column select signal RDYSEL[0] may be asserted while the word line signal WL is still asserted. Additionally, or alternatively, the read column select signal RDYSEL[0] may be asserted responsive to the next transition in the clock signal CLK. The assertion of the read column select signal RDYSEL[0] may cause the bit line 106a and bit bar line 108a to be coupled to the respective input terminals of the sense amplifier 120, thereby causing a voltage differential between the input terminal of the sense amplifier 120 that is based on the logic value of the data bit stored by the memory cell 102a.

In various embodiments, the sense amplifier precharge signal SAPCH may be asserted prior to assertion of the read column select signal RDYSEL[0] to precharge the sense amplifier, and may be de-asserted when the read column select signal RDYSEL[0] is asserted (e.g., at time t2) to precharge the sense amplifier. The sense amplifier enable signal SAEN may be asserted responsive to the de-assertion of the read column select signal RDYSEL[0] (e.g., at a time t3) to enable the sense amplifier. Accordingly, the sense amplifier 120 may read the bit stored by the memory cell 102a. For example, the sense amplifier 120 may amplify the voltage differential created between the input terminals of the sense amplifier 120 based on the assertion of the read column select signal RDYSEL[0] to resolve the bit stored by the memory cell 102a.

In various embodiments, the sense amplifier enable signal SAEN may then be de-asserted to disable the read of the sense amplifier 120. The de-assertion of the sense amplifier enable signal SAEN may occur prior to the next transition of the clock signal CLK. The sense amplifier precharge signal SAPCH may be asserted responsive to the de-assertion of the sense amplifier enable signal SAEN to precharge the sense amplifier for the next read operation. In some embodiments, the combined duration of the assertion of the RDY- SEL, SAEN, and SAPCH signals may equal to or less than one half of a clock cycle, as shown in FIG. 1. For example, the RDYSEL signal may be asserted for ⅛ clock cycle, the SAEN signal may be asserted for ⅛ clock cycle, and the SAPCH signal may be asserted for ¼ clock cycle. Alternatively, the RDYSEL signal may be asserted for ¼ clock cycle, the SAEN signal may be asserted for ⅛ clock cycle, and the SAPCH signal may be asserted for ⅛ clock cycle. It will be apparent that other suitable durations of the RDYSEL, SAEN, and/or SAPCH signals may be used in other embodiments. In some embodiments, a programmable replica or inverter chain-based timing generator may be used for post-silicon tuning of the self-timed edges of the signals.

In various embodiments, the other memory cells 102b-d may be read based on the one assertion of the word line signal (e.g., without re-asserting the word line signal). For example, at time t4 after t3, the sense amplifier precharge signal may transition to precharge the sense amplifier circuit 120. In some embodiments, the sense amplifier precharge signal may transition at the same time that (e.g., responsive to) the sense amplifier enable signal SAEN is de-asserted to disable the read of the first memory cell.

At time t5 after t4 (e.g., at the next transition of the clock signal CLK, such as the transition from phase 2 to phase 3), the read select signal for the second column (e.g., RDYSEL [1]) may be asserted. The word line signal may remain de-asserted (e.g., in the logic low position). Accordingly, one assertion of the word line signal may be used to read data from multiple memory cells 102a-d.

The read column select signal RDYSEL[1] may be asserted for a time period that is less than one phase of the clock signal CLK. The sense amplifier enable signal SAEN may be asserted to enable the sense amplifier 120 responsive to the de-assertion transition of the read column select signal. The sense amplifier 120 may read the data stored by the memory cell 102b.

In various embodiments, the sense amplifier enable signal SAEN may then be de-asserted to un-enable the sense amplifier 120. The de-assertion of the sense amplifier enable signal SAEN may occur prior to the next transition of the clock signal CLK.

A similar process may be performed to read the memory cell 102c and 102d without reasserting the word line signal, as shown in FIG. 3. The word line 104 may remain sufficiently charged to read the memory cells 102a-d with one assertion of the word line 104. In other embodiments, another suitable number of memory cells may be read sequentially after one assertion of the word line.

Although the sequence of read column select signals are shown to start with RDYSEL[0] sequentially proceed to RDYSEL[1], RDYSEL[2], and RDYSEL[3], the multi-read process can start with any column and proceed with reading the respective memory cells in any order (e.g., any defined address sequence). Furthermore, in some instances, the multi-read process may only read memory cells from a subset of the columns that are multiplexed with the sense amplifier. For example, the multi-read process may only assert read column select signals RDYSEL[1] and RDYSEL [2] if the other data is not needed at that time. Similarly, in some embodiments, the multi-write process may start with any column and proceed with writing the respective memory cells in any order (e.g., any defined address sequence). Additionally, in some instances, the multi-write process may only write to a subset of the columns that are included in the set of columns that are writable for a given multi-write process.

Figure 4:
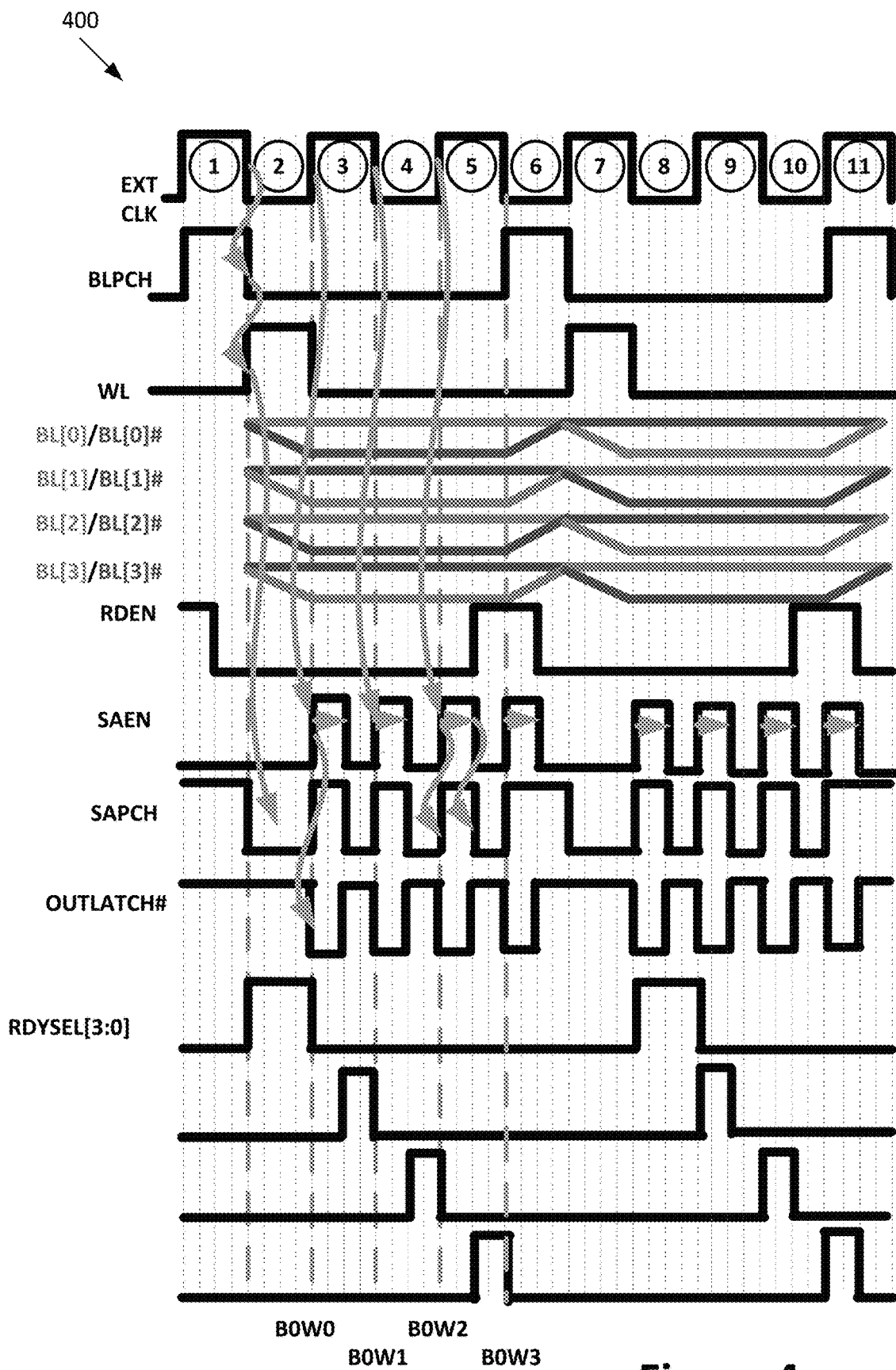
FIG. 4 illustrates example waveforms for a multi-read process performed with a memory circuit having a decoupled sense amplifier arrangement, in accordance with various embodiments.

FIG. 4 illustrates waveforms 400 for a multi-read process that may be performed with a memory circuit that includes a decoupled read amplifier arrangement (e.g., the memory circuit 200). The waveforms 400 may be similar to the waveforms 300. However, the decoupled read amplifier arrangement may not require such strict timing constraints for the sense amplifier compared with the coupled sense amplifier arrangement. For example, the assertion of the sense amplifier precharge signal SAPCH may overlap with the assertion of the sense amplifier enable signal SAEN (e.g., after a short delay from assertion of the SAEN signal to enable evaluation of the bit to be read.

Figure 5:
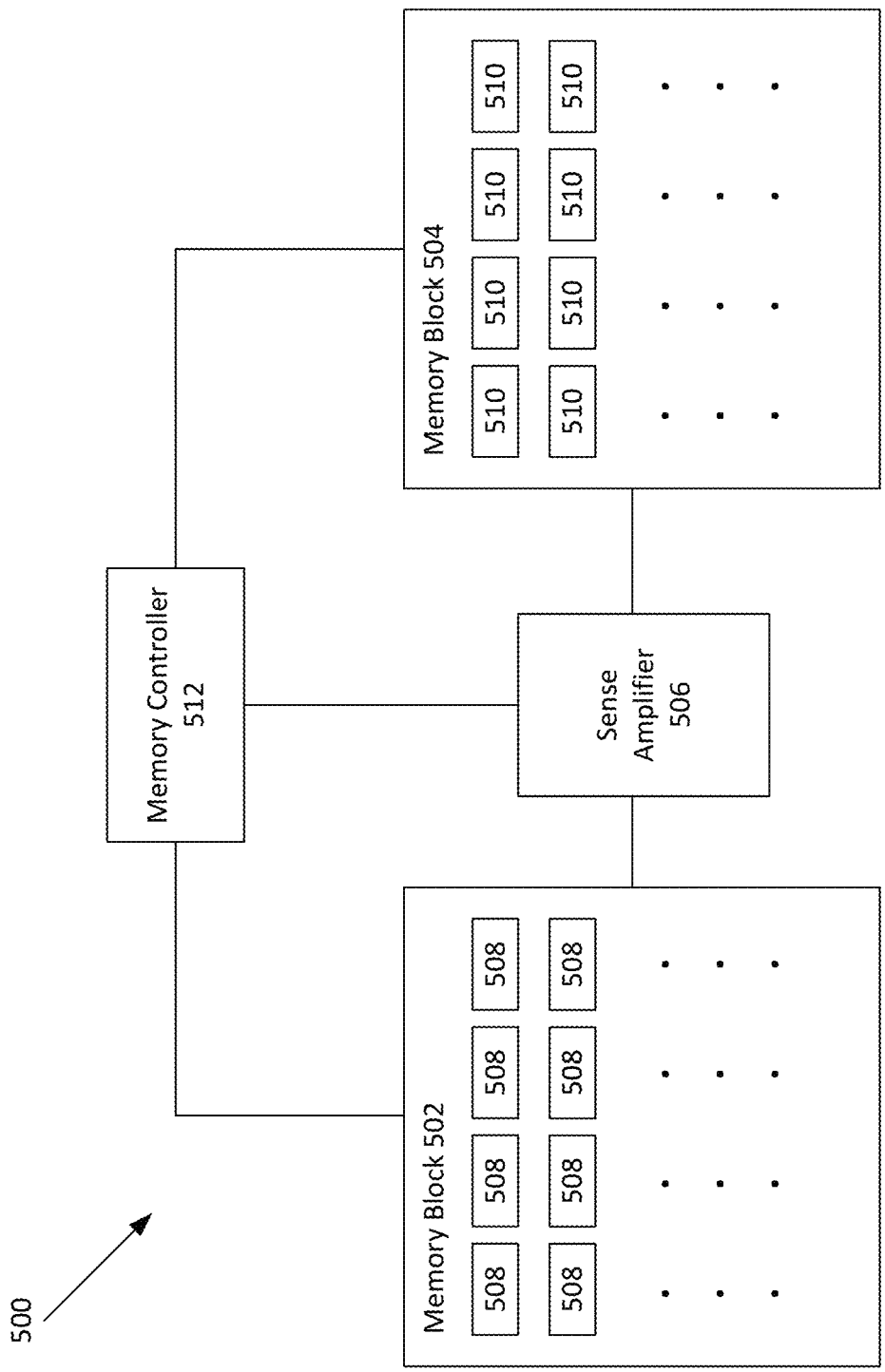
FIG. 5 illustrates a circuit including multiple memory blocks coupled to a sense amplifier, in accordance with various embodiments.

In some embodiments, the same sense amplifier may be used to read data from memory cells of different memory blocks (e.g., blocks that do not share a same word line, bit line, and/or bit line precharge line). For example, FIG. 5 illustrates a circuit 500 that includes a first memory block 502 and a second memory block 504 coupled to a sense amplifier 506. In some embodiments, the first memory block 502 may be referred to as a left memory block and the second memory block 504 may be referred to as a right memory block, although other orientations may be used (e.g., top/bottom, etc.). The first memory block 502 may include a plurality of memory cells 508 that are arranged in columns and multiplexed with the sense amplifier 506. The second memory block 504 may include a plurality of memory cells 510 that are arranged in columns and are also multiplexed with the sense amplifier 506. The first memory block 502 and second memory block 504 may include independent word lines, bit lines, and bit line precharge lines. The circuit 500 may further include a memory controller 512 to control operation of the memory blocks 502 and 504 and/or sense amplifier 506.

In some embodiments, data from the first memory block 502 and second memory block 504 may be read sequentially in a multi-read process. For example, a set of memory cells 508 of the first memory block 502 that are coupled with a first word line (e.g., in the same row) and multiplexed with the sense amplifier 506 may be read in sequence (e.g., using the waveforms 300 or 400). Additionally, a set of memory cells 510 of the second memory block 504 that are coupled with a second word line and multiplexed with the sense amplifier 506 may be read in sequence after the memory cells of the first memory block 502 are read. In some embodiments, the bit lines of the second memory block 504 may be precharged (e.g., by the bit line precharge signal) while data from the first memory block 502 is being read by the sense amplifier 506. In some embodiments, the word line coupled to the memory cells of the second memory block 504 may also be asserted (e.g., after the precharge on the second memory block 504) while the data from the first memory block 502 is being read by the sense amplifier 506.

Figure 6:
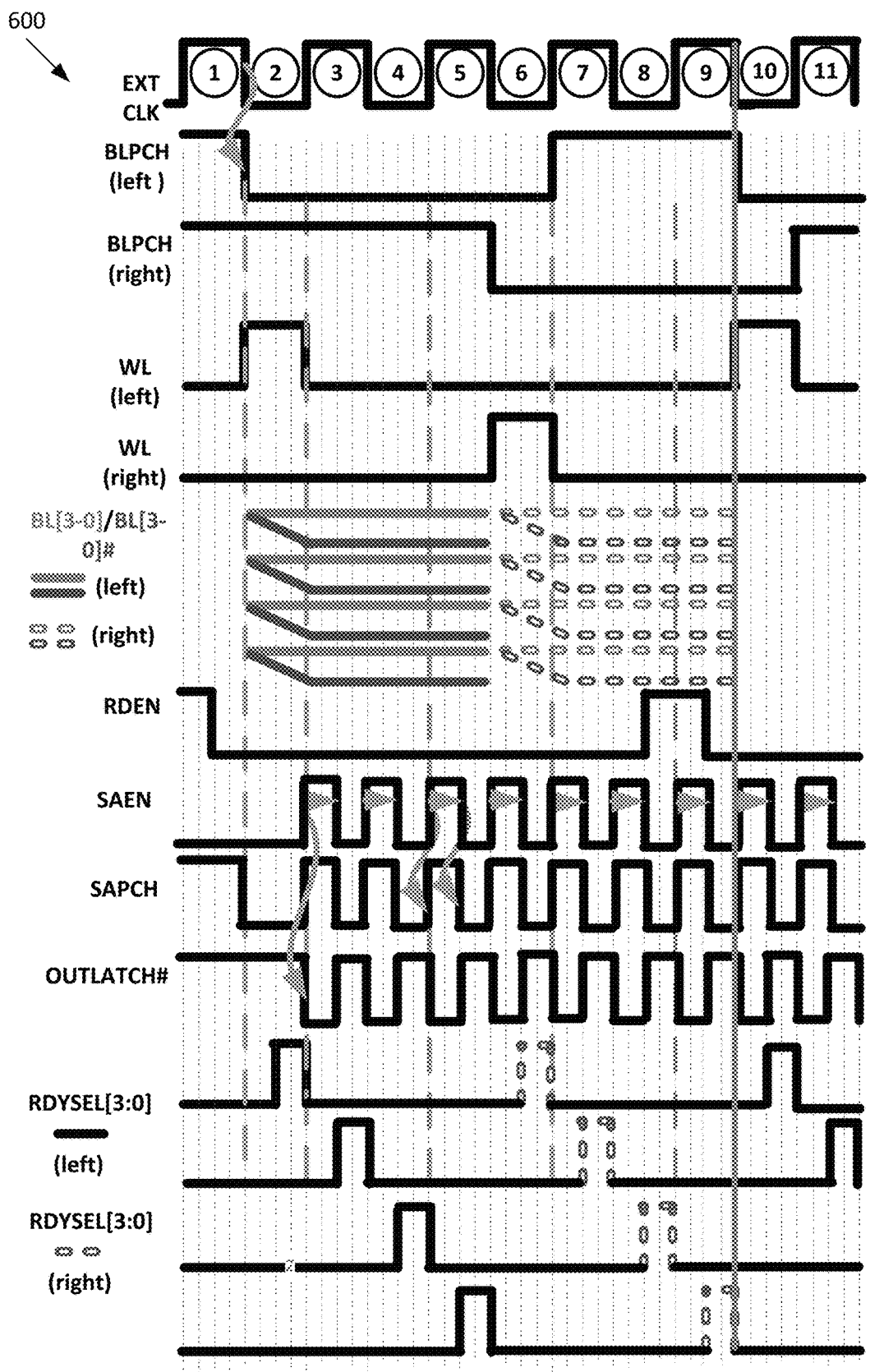
FIG. 6 illustrates example waveforms for a multi-read process to sequentially read data from memory cells of multiple memory blocks using the same sense amplifier, in accordance with various embodiments.

FIG. 6 illustrates waveforms 600 for sequentially reading a first set of memory cells of a first memory block associated with a first word line, followed by a second set of memory cells of a second memory block associated with a second word line. The first set of memory cells and second set of memory cells may also include separate bit lines. The waveforms 600 are shown for a memory circuit that includes a coupled sense amplifier arrangement (e.g., the memory circuit 100). However, similar techniques may be used with a memory circuit that includes a decoupled sense amplifier (e.g., the memory circuit 200).

As shown, the memory cells of the first memory block are read using similar waveforms to those described with respect to FIG. 1. The bit line precharge signal BLPCH for the second memory block may be asserted while data is being read by the sense amplifier (e.g., while one or more of the RDYSEL signals for the first memory block and/or the SAEN signal are asserted). The word line signal for the selected row of the second memory block may then be asserted and the data may be read from the second set of memory cells of the second memory block (e.g., again using similar waveforms to those described with respect to FIG. 1). In some embodiments, the word line signal for the second memory block may be asserted while the SAEN signal is asserted to read the last memory cell of the first set of memory cells. The read column select signal for the first memory cell of the second memory block may be asserted in the half cycle of the clock following the assertion of the SAEN signal to read the last memory cell of the first set of memory cells. Accordingly, with the waveforms 600, two memory cells may be read per clock cycle (e.g., eight memory cells may be read during four clock cycles).

Figure 7:
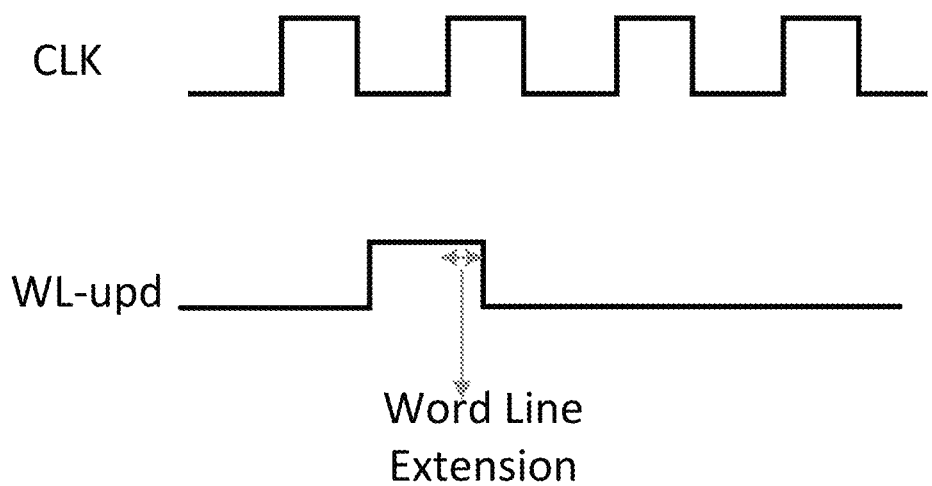
FIG. 7 illustrates an extended word line signal that may be asserted for a duration of greater than one clock phase as part of a multi-read process, in accordance with various embodiments.

In some embodiments, the word line signal WL in the multi-read process described herein (e.g., with respect to FIG. 3, 4, or 6) may be asserted for one phase of the clock signal CLK (e.g., one half of a clock cycle). However, in other embodiments, the word line signal WL may be asserted for longer than one phase, which may cause the voltage differential that is created between the bit line and bit line bar pairs to be greater than for a word line signal one a duration of one clock phase. For example, FIG. 7 illustrates a word line signal WL-upd that has a duration of greater than one clock phase (e.g., between ½ of a clock cycle and one full clock cycle).

This increased voltage differential provided by the longer duration of the word line signal may cause maintenance of a sufficient voltage differential between the bit line and bit line bar pairs to enable the multiple reads. Additionally, or alternatively, the precharge of the coupled sense amplifier may cause charge sharing to the bit line or bit bar line (e.g., to the low side of the differential) for subsequent reads that may interfere with the subsequent reads. The extended duration of the word line signal may reduce the interference of the charge sharing with the reads. Additionally, or alternatively, the extended duration of the word line signal may compensate for one or more other potential causes of reduction in the bit line differential, such as noise, coupling, and/or leakage.

In other embodiments, the word line may be asserted for a first time period (e.g., one half clock cycle) followed by a second time period in which the word line signal is reduced but not completely de-asserted (e.g., still greater than zero volts). The NMOS pass transistor of the memory cell may be on (e.g., weakly on) during the second time period to enable maintenance of the voltage differential between the bit line and bit bar line.

Figure 8A:
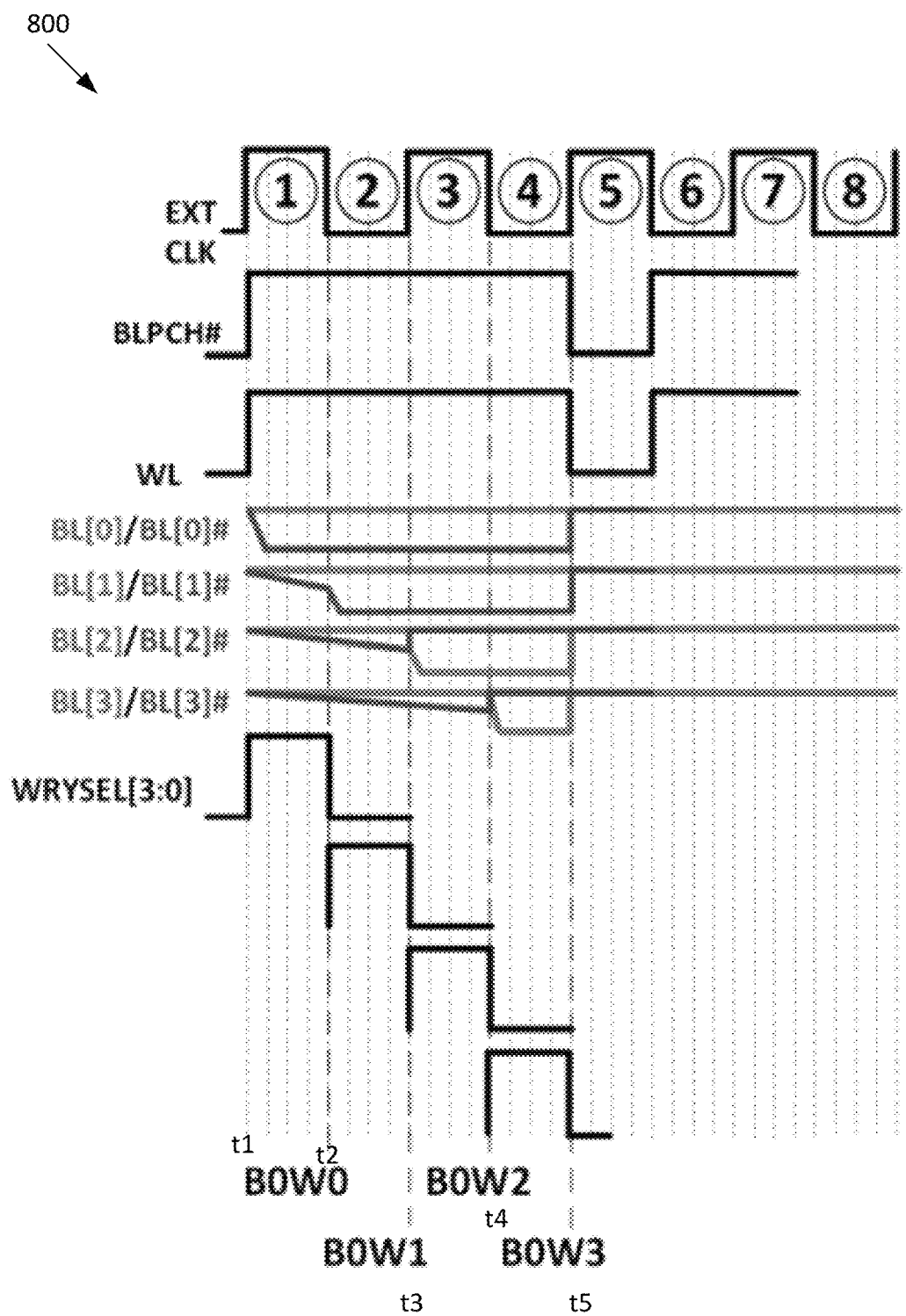
FIG. 8A illustrates example waveforms for a multi-write process, in accordance with various embodiments.

FIG. 8A illustrates waveforms 800 for a multi-write process to be performed on a memory circuit (e.g., memory circuit 100 and/or 200), in accordance with various embodiments. The waveforms 800 may include a bit line precharge signal BLPCH (illustrated in FIG. 8 as bit line precharge bar signal BLPCH# which is an inverted version of the bit line precharge signal BLPCH), a word line signal WL, and write column select signals WRYSEL[3:0], which may be provided to the memory circuit by a memory controller. The waveforms 800 shown in FIG. 8 also include a clock signal CLK bit line signals BL[0:3] and bit line bar signals BL[0:3]#.

The waveforms 800 may be used to perform the multi-write process to write data to a set of memory cells that are coupled with a same bit line precharge line and/or word line. Prior to time t1, the bit line precharge signal may be asserted to precharge the bit lines and/or bit bar lines associated with the set of memory cells. Then, at time t1, the bit line precharge signal may be de-asserted. Additionally, at time t1 or after t1, the word line signal may be asserted. The assertion of the word line signal may be maintained while multiple write column select signals WRYSEL[3:0] are sequentially asserted to write data to the respective memory cells of the set of memory cells. For example, as shown in FIG. 8, the write column select signal WRYSEL[0] from time t1 to time t2, the write column select signal WRYSEL[1] may be asserted from time t2 to time t3, the write column select signal WRYSEL[2] may be asserted from time t3 to time t4, and the write column select signal WRYSEL[3] may be asserted from time t4 to time t5. The order of the sequential assertions of the write column select signals WRYSEL[0:3] shown in FIG. 8A is merely an example, and it will be apparent that another order may be used in other embodiments. The word line signal may be asserted from time t1 to time t5. The duration of assertion of the write column select signals WRYSEL[0:3] may be one clock phase (one half of a clock cycle), as shown in FIG. 8. Alternatively, the duration of assertion of the write column select signals WRYSEL[0:3] may be one full clock cycle or another suitable duration. The logic value of the data that is written to each memory cell may be determined based on the data provided by the input data circuitry (e.g., input data circuitry 114 of memory circuit 100) while the respective write column select signal WRYSEL[0:3] is asserted.

Accordingly, the multi-write process performed using the waveforms 800 may enable data to be consecutively written to multiple memory cells after a single precharge of the bit lines and/or bit bar lines while the associated word line signal remains asserted. In the example illustrated in FIG. 8A, four memory cells are written in five clock phases (2.5 clock cycles). Alternatively, for a two-phase write operation, four memory cells may be written in five clock cycles. Furthermore, other embodiments may write a different number of memory cells for each multi-write process (e.g., for one precharge of the bit lines and/or one assertion of the associated word line signal).

The multi-write process described herein may improve write bandwidth compared to prior techniques. Additionally, or alternatively, the multi-write process may reduce the pre-charge energy required to write the set of memory cells, since only a single precharge operation is required, thereby providing power savings.

Figure 8B:
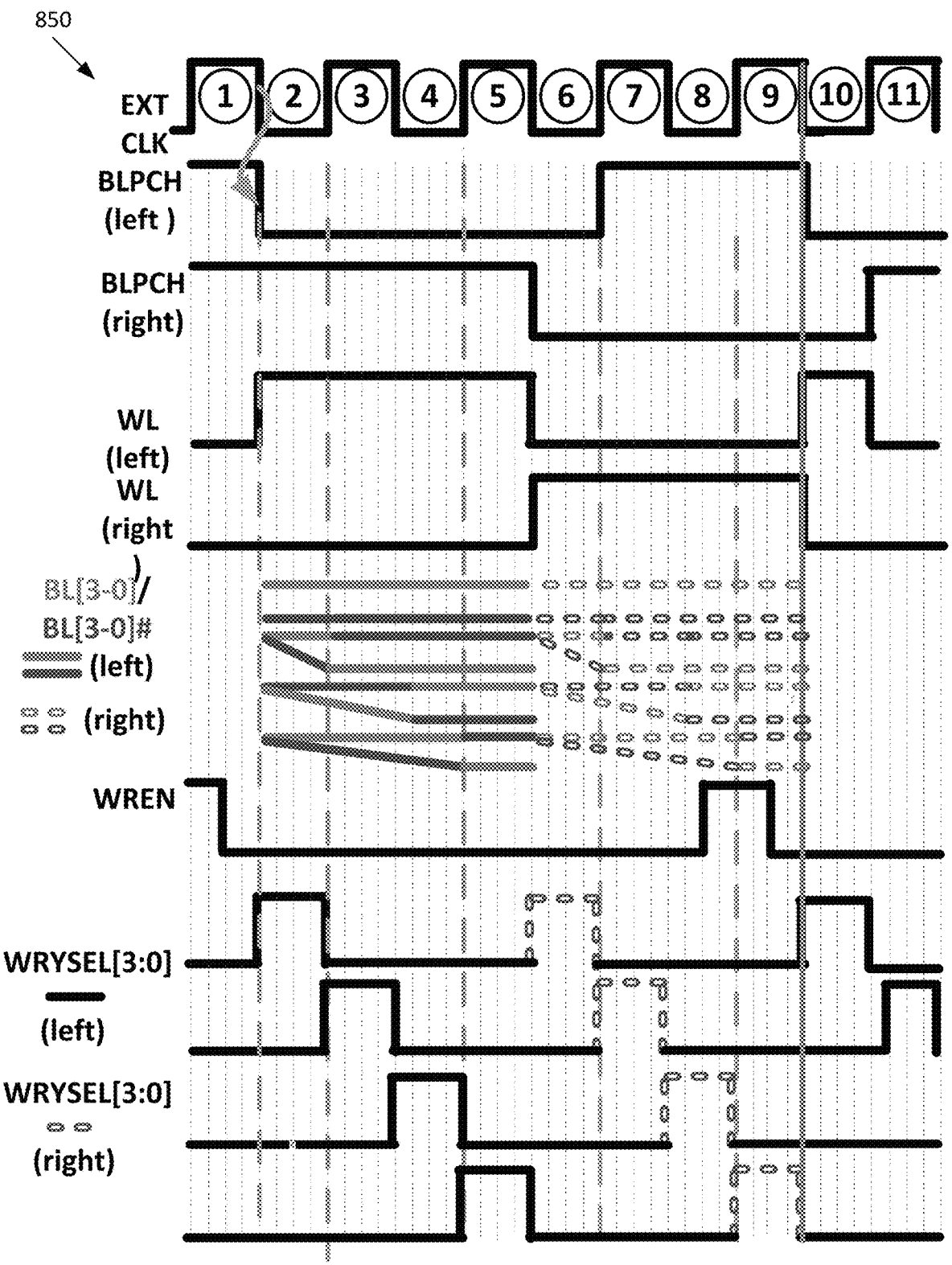
FIG. 8B illustrates example waveforms for a multi-write process to sequentially write a first set of memory cells and a second set of memory cells that are associated with different bit line precharge lines, in accordance with various embodiments.

In some embodiments, the multi-write process may be performed to sequentially write a first set of memory cells and a second set of memory cells that are associated with different bit line precharge lines (e.g., to receive separate bit line precharge signals). The first and second sets of memory cells may or may not be part of different memory blocks (e.g., memory blocks 502 and 504 of FIG. 5). FIG. 8B illustrates example waveforms 850 for such a multi-write process, in accordance with some embodiments. As shown, the bit lines and/or bit bar lines associated with the second set of memory cells may be precharged (e.g., by asserting a bit line precharge signal) while data is being written to the first set of memory cells (e.g., while the last WRYSEL signal in the sequence for the first set of memory cells, such as WRYSEL[3], is asserted).

In some embodiments, a clamp circuit (e.g., including a diode, such as a diode-connected transistor) may be coupled to the bit line and/or bit bar line. The clamp circuit may clamp the bit line and/or bit bar line to prevent the voltage of the bit line and/or bit bar line from falling as far after being precharged.

Figure 9:
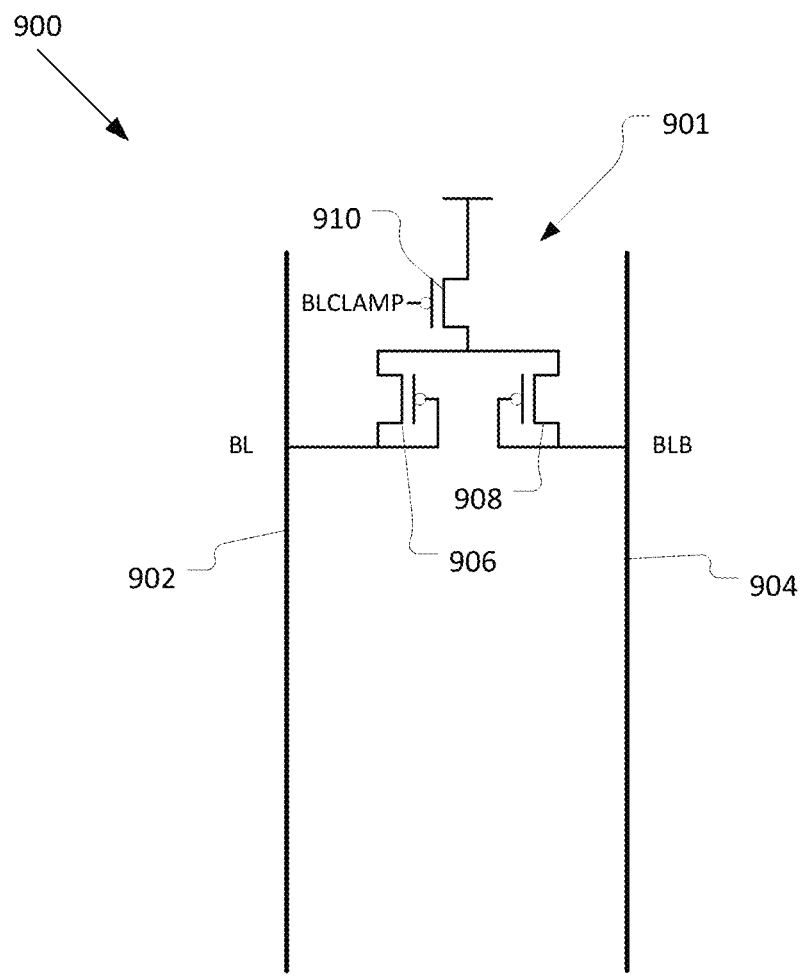
FIG. 9 illustrates a diode clamp circuit that may be coupled to a bit line and/or bit bar line of a memory circuit, in accordance with various embodiments.

For example, FIG. 9 illustrates a diode clamp circuit 901 that may be coupled to the bit line 902 and/or bit bar line 904 in accordance with various embodiments. The diode clamp circuit 901 may include a diode-connected transistor 906 coupled to the bit line, and a diode-connected transistor 908 coupled to the bit bar line 904. In some embodiments, an interrupt transistor 910 may be coupled between a power supply 912 and the diode-connected transistors 906 and 908. The interrupt transistor 910 may receive a bit line clamp signal BLCLAMP to selectively couple the diode-connected transistors 906 and 908 between the power supply 912 and the respective bit line 902 or bit bar line 904. In some embodiments, the bit line clamp circuits 901 coupled to different bit lines 902 may be independently controlled by separate bit line clamp signals. For example, when a burst mode is enabled, the interrupt transistor 910 may be on when the corresponding write column select signal WRYSEL is not asserted (e.g., logic 0). The interrupt transistor 910 may be turned off while the respective write column select signal WRYSEL is asserted (e.g., while data is being written to the respective memory cell). In some embodiments, the burst mode may be enabled for a set of memory cells while a multi-write process is being performed on the set of memory cells.

As discussed herein, in some embodiments, the multi-read and/or multi-write processes may read or write data in both rising and falling clock edges (e.g., two bits per clock cycle). Accordingly, other logic in the data path that interfaces with the memory circuit may need to be modified to account for the increased memory bandwidth. In some embodiments, the logic may include dual edge triggered flip-flops (DEFFs) and/or other modifications.

Figure 10:
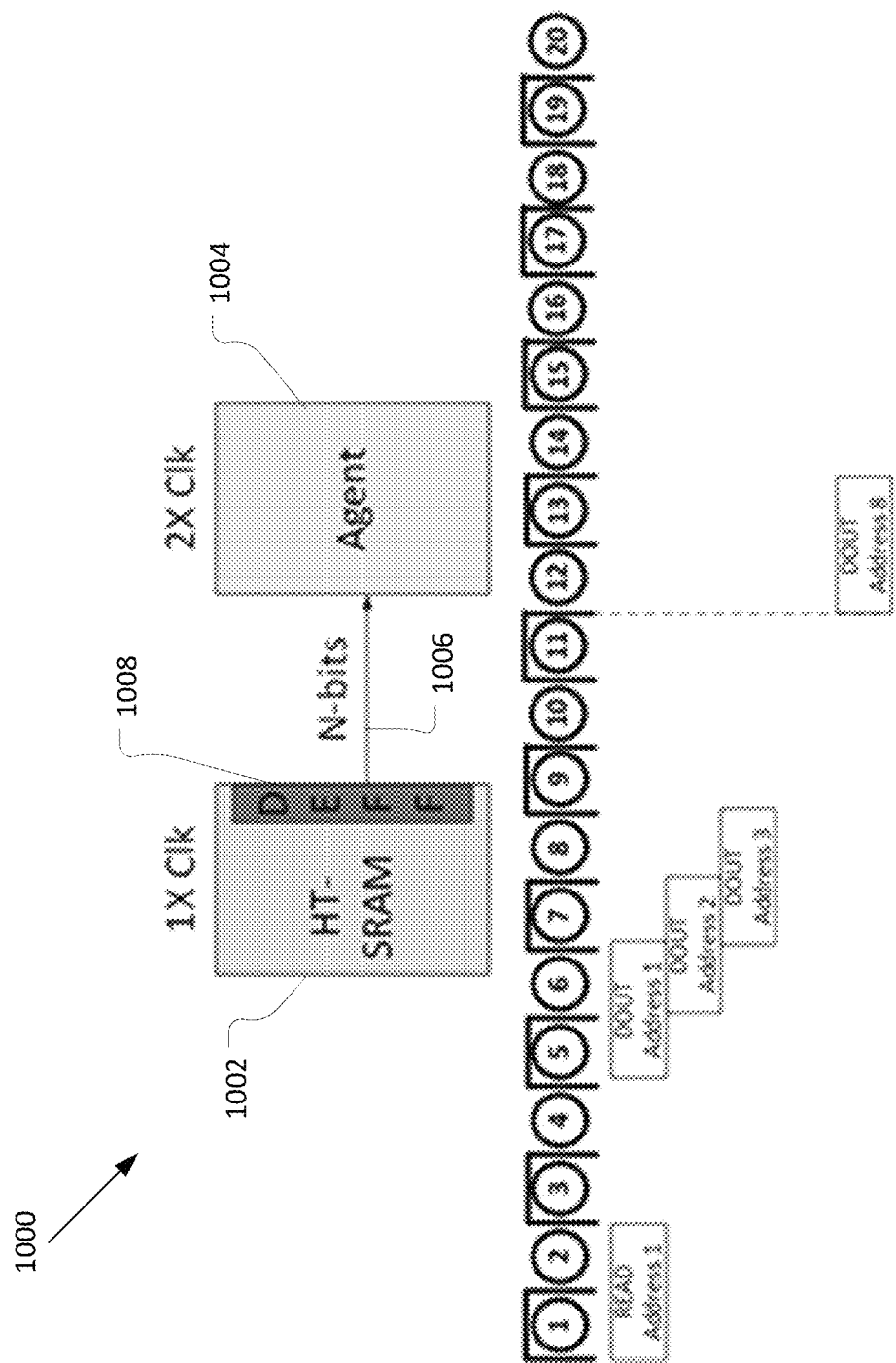
FIG. 10 illustrates a circuit including a high-throughput SRAM (HT-SRAM) interfaced with a compute agent via an interconnect, in accordance with various embodiments.

For example, FIG. 10 illustrates a circuit 1000 including a high-throughput SRAM (HT-SRAM) 1002 interfaced with a compute agent 1004 via an interconnect 1006, in accordance with various embodiments. The HT-SRAM 1002 may correspond to the memory circuit described herein (e.g., memory circuit 100 and/or 200), and may perform the multi-read and/or multi-write process described herein. As shown in FIG. 10, the compute agent 1004 may operate at twice the clock speed of the HT-SRAM 1002 in order to match the throughput of the HT-SRAM. The interconnect 1006 between the HT-SRAM 1002 and the compute agent 1004 may also operate at twice the clock speed of the HT-SRAM 1002. The output of the HT-SRAM may be driven from a dual-edge triggered flip flop 1008, which provides new data at both edges of the clock signal (rising and falling edges).

Figure 11:
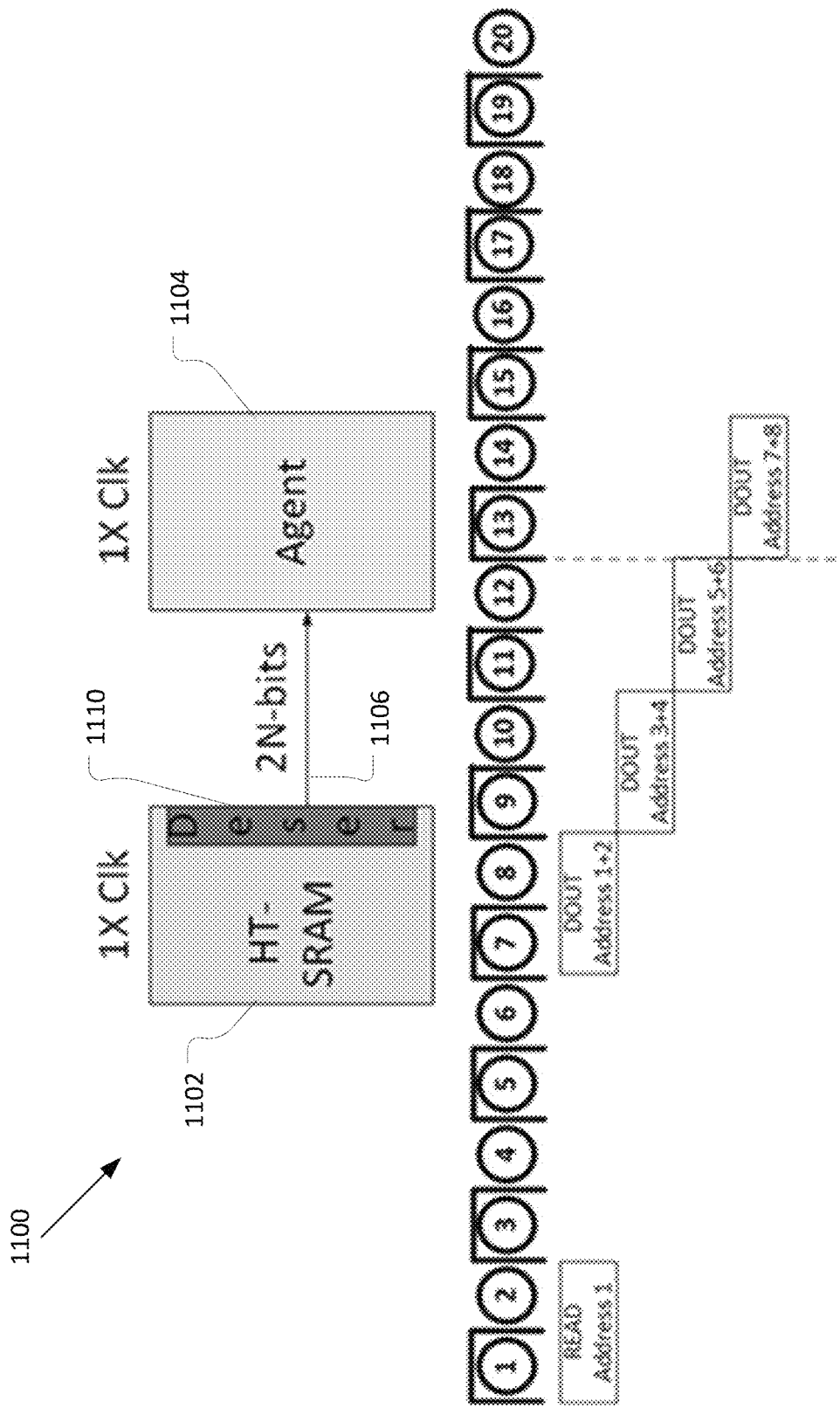
FIG. 11 illustrates another circuit including a HT-SRAM interfaced with a compute agent via an interconnect, in accordance with various embodiments.

FIG. 11 illustrates another circuit 1100 including an HT-SRAM 1102 interfaced with a compute agent 1104 via an interconnect 1106, in accordance with various embodiments. In circuit 1100, the compute agent 1104 may operate at the same clock speed as the HT-SRAM 1102. However, the bandwidth of the interconnect 1106 may be increased (e.g., doubled) from the bandwidth of the interconnect 1006. In this model, the data (N-bits) from two consecutive addresses inside the HT-SRAM 1102 is made available to the compute agent 1106 only at one phase of the clock (e.g., the positive phase), and hence the interconnect 1106 is 2N-bits wide. Note that in this model, the first 2N-bit word has 1 cycle additional latency. However, after this initial latency, a sustained 2×bandwidth is delivered from the HT-SRAM 1102. In order to present 2N-bits to the compute agent 1104, the output of the HT-SRAM 1102 may be driven by N high-phase latch and N low-phase latch, denoted as deserializer 1110 in FIG. 11.

Figure 12:
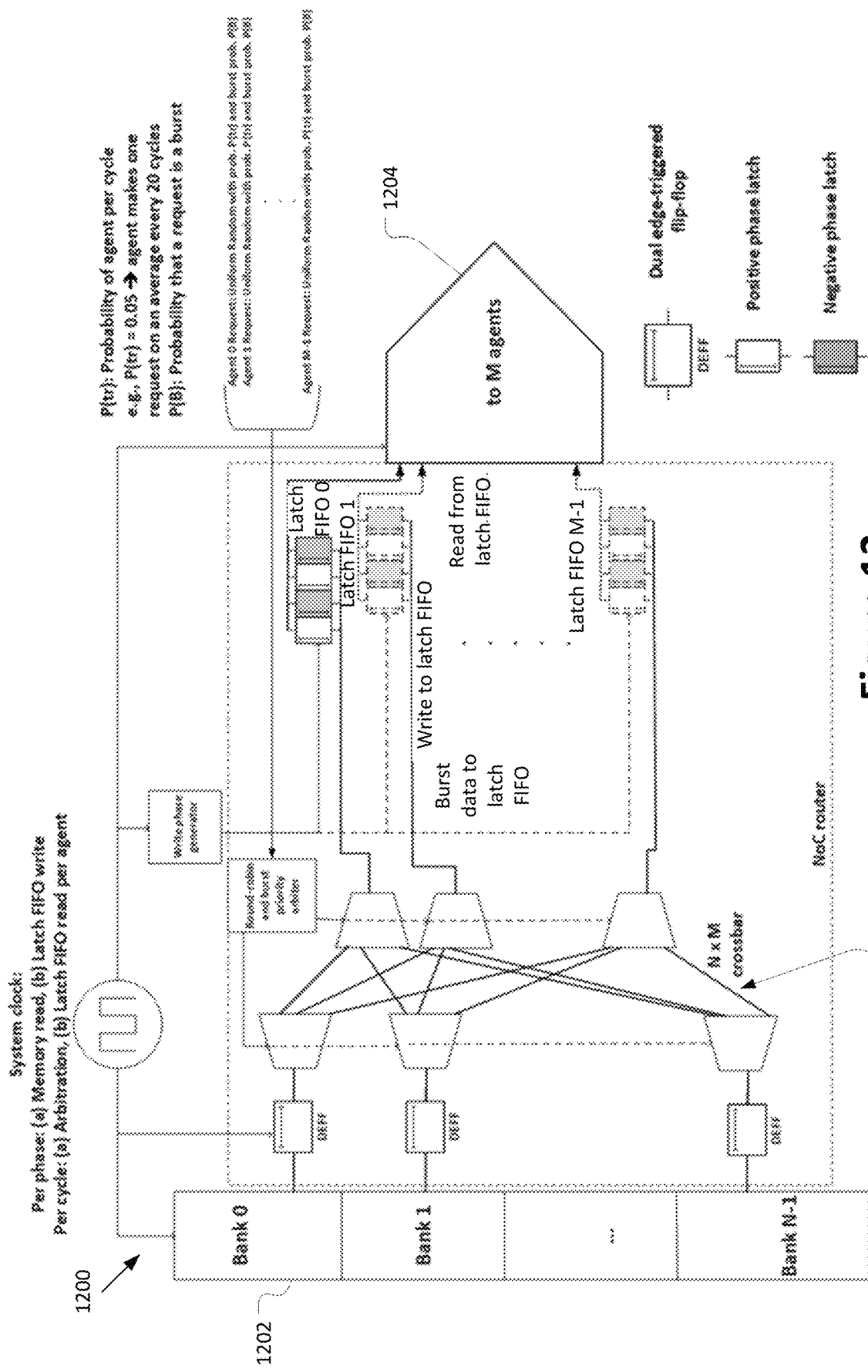
FIG. 12 illustrates a circuit in which multiple compute agents read/write to a shared set of memory arrays, in accordance with various embodiments.

FIG. 12 illustrates another circuit 1200 in which multiple compute agents 1204 read/write to a shared set of memory arrays 1202. The circuit 1200 may include a pipelined interconnect (e.g. crossbar) 1212, which allows any compute agent 1204 to read/write from any memory array 1202. An arbiter (not shown) arbitrates the access given to a particular memory array 1202. A new burst read/write request mode may be defined which will allow multiple data values to be read/written from a given memory array 1202 by a particular compute agent 1204. This will free-up the memory array 1202 in question for subsequent accesses and therefore result in overall latency and throughput improvement in the system. Since the compute agent 1204 does not increase its throughput, the data being read/written in a burst manner may be accumulated (buffered) at each compute agent 1204. This accumulation or buffering may be performed using a first-in-first-out (FIFO) circuit that includes +ve and −ve latches for read/write operations in both clock phases. Similarly to the circuit 1000, the output of the memory arrays 1202 may be driven using dual-edge triggered flip-flops (DEFFs). Pipeline stages in the interconnect 1212 may also be constructed using DEFFs.

Figure 13:
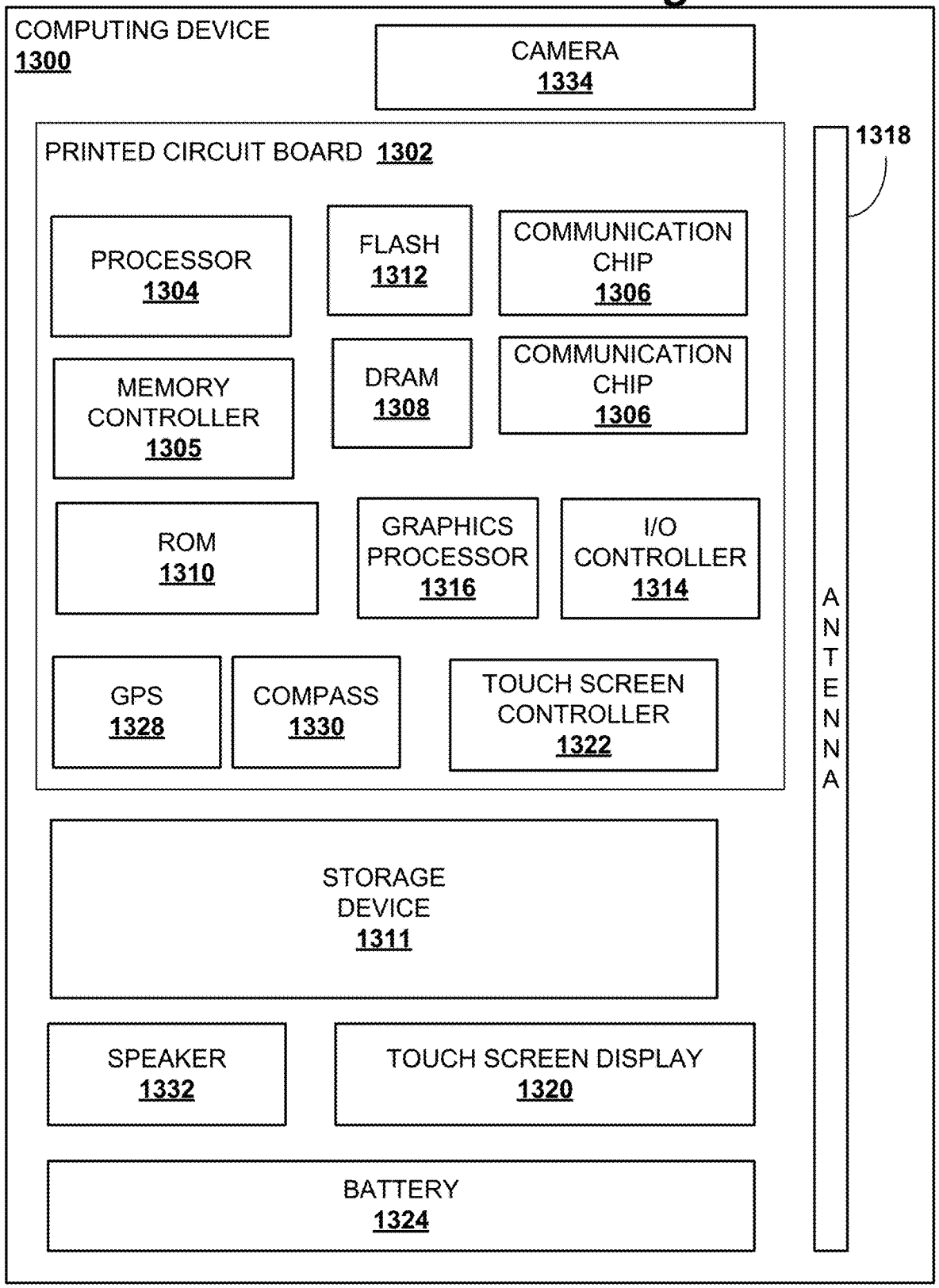
FIG. 13 illustrates an example system configured to employ the apparatuses and methods described herein, in accordance with various embodiments.

FIG. 13 illustrates an example computing device 1300 that may employ the apparatuses and/or methods described herein (e.g., memory circuit 100, memory circuit 200, waveforms 300, waveforms 400, circuit 500, waveforms 600, extended word line signal of FIG. 7, waveforms 800, waveforms 850, circuit 900, circuit 1000, circuit 1100, and/or circuit 1200), in accordance with various embodiments. As shown, computing device 1300 may include a number of components, such as one or more processor(s) 1304 (one shown) and at least one communication chip 1306. In various embodiments, the one or more processor(s) 1304 each may include one or more processor cores. In various embodiments, the at least one communication chip 1306 may be physically and electrically coupled to the one or more processor(s) 1304. In further implementations, the communication chip 1306 may be part of the one or more processor(s) 1304. In various embodiments, computing device 1300 may include printed circuit board (PCB) 1302. For these embodiments, the one or more processor(s) 1304 and communication chip 1306 may be disposed thereon. In alternate embodiments, the various components may be coupled without the employment of PCB 1302.

Depending on its applications, computing device 1300 may include other components that may or may not be physically and electrically coupled to the PCB 1302. These other components include, but are not limited to, memory controller 1305, volatile memory (e.g., dynamic random access memory (DRAM) 1308), non-volatile memory such as read only memory (ROM) 1310, flash memory 1312, storage device 1311 (e.g., a hard-disk drive (HDD)), an I/O controller 1314, a digital signal processor (not shown), a crypto processor (not shown), a graphics processor 1316, one or more antenna 1318, a display (not shown), a touch screen display 1320, a touch screen controller 1322, a battery 1324, an audio codec (not shown), a video codec (not shown), a global positioning system (GPS) device 1328, a compass 1330, an accelerometer (not shown), a gyroscope (not shown), a speaker 1332, a camera 1334, and a mass storage device (such as hard disk drive, a solid state drive, compact disk (CD), digital versatile disk (DVD)) (not shown), and so forth. In various embodiments, the processor 1304 may be integrated on the same die with other components to form a System on Chip (SoC).

In some embodiments, the one or more processor(s) 1304, flash memory 1312, and/or storage device 1311 may include associated firmware (not shown) storing programming instructions configured to enable computing device 1300, in response to execution of the programming instructions by one or more processor(s) 1304, to practice all or selected aspects of the methods described herein. In various embodiments, these aspects may additionally or alternatively be implemented using hardware separate from the one or more processor(s) 1304, flash memory 1312, or storage device 1311.

In various embodiments, one or more components of the computing device 1300 may include the memory circuit 100, memory circuit 200, circuit 500, circuit 900, circuit 1000, circuit 1100, and/or circuit 1200, and/or may implement the waveforms 300, waveforms 400, waveforms 600, extended word line signal of FIG. 7, waveforms 800, and/or waveforms 850 described herein. For example, the memory circuit 100, memory circuit 200, circuit 500, circuit 900, circuit 1000, circuit 1100, and/or circuit 1200 may be included in, and/or the waveforms 300, waveforms 400, waveforms 600, extended word line signal of FIG. 7, waveforms 800, and/or waveforms 850 may be implemented in processor 1304, communication chip 1306, I/O controller 1314, memory controller 1305, and/or another component of computing device 1300.

The communication chips 1306 may enable wired and/or wireless communications for the transfer of data to and from the computing device 1300. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1306 may implement any of a number of wireless standards or protocols, including but not limited to IEEE 702.20, Long Term Evolution (LTE), LTE Advanced (LTE-A), General Packet Radio Service (GPRS), Evolution Data Optimized (Ev-DO), Evolved High Speed Packet Access (HSPA+), Evolved High Speed Downlink Packet Access (HSDPA+), Evolved High Speed Uplink Packet Access (HSUPA+), Global System for Mobile Communications (GSM), Enhanced Data rates for GSM Evolution (EDGE), Code Division Multiple Access (CDMA), Time Division Multiple Access (TDMA), Digital Enhanced Cordless Telecommunications (DECT), Worldwide Interoperability for Microwave Access (WiMAX), Bluetooth, derivatives thereof, as well as any other wireless protocols that are designated as 3G, 4G, 5G, and beyond. The computing device 1300 may include a plurality of communication chips 1306. For instance, a first communication chip 1306 may be dedicated to shorter range wireless communications such as Wi-Fi and Bluetooth, and a second communication chip 1306 may be dedicated to longer range wireless communications such as GPS, EDGE, GPRS, CDMA, WiMAX, LTE, Ev-DO, and others.

In various implementations, the computing device 1300 may be a laptop, a netbook, a notebook, an ultrabook, a smartphone, a computing tablet, a personal digital assistant (PDA), an ultra-mobile PC, a mobile phone, a desktop computer, a server, a printer, a scanner, a monitor, a set-top box, an entertainment control unit (e.g., a gaming console or automotive entertainment unit), a digital camera, an appliance, a portable music player, or a digital video recorder. In further implementations, the computing device 1300 may be any other electronic device that processes data.

Some non-limiting Examples of various embodiments are provided below.

Example 1 is a circuit comprising a memory circuit and a memory controller. The memory circuit includes a set of memory cells multiplexed with a sense amplifier, the set of memory cells coupled to a same word line. The memory controller is to: provide a single assertion of a word line signal on the word line to select the set of memory cells for a multi-read operation; and sequentially read data from the set of memory cells, using the sense amplifier, based on the single assertion of the word line signal.

Example 2 is the circuit of Example 1, wherein the memory controller is further to precharge bit lines associated with respective memory cells of the set of memory cells prior to the single assertion of the word line signal.

Example 3 is the circuit of Example 1 or 2, wherein, to sequentially read the data from the set of memory cells, the memory controller is to: assert a first read column select signal associated with a first memory cell of the set of memory cells; enable, responsive to de-assertion of the first read column select signal, the sense amplifier to read a first data bit stored by the first memory cell; and precharge, responsive to disablement of the sense amplifier, the sense amplifier to prepare the sense amplifier to read a second data bit stored by a second memory cell of the set of memory cells.

Example 4 is the circuit of Example 3, wherein the memory controller is to assert a sense amplifier precharge signal to precharge the sense amplifier, and wherein the memory controller is further to assert a second read column select signal associated with the second memory cell when the precharge signal is de-asserted.

Example 5 is the circuit of Example 3 or 4, wherein the combined duration of the assertion of the first read column select signal, the enablement of the sense amplifier, and the precharge of the sense amplifier is one phase of a clock signal associated with the memory circuit.

Example 6 is the circuit of any of Examples 3-5, wherein the set of memory cells is a first set of memory cells, wherein the memory circuit further includes a second set of memory cells that are multiplexed with the sense amplifier, wherein the second set of memory cells are coupled to a different bit line precharge line than the first set of memory cells, and wherein the memory circuit is to: precharge bit lines associated with the second set of memory cells while data from the first set of memory cells is being read; and read data from the second set of memory cells after the precharge of the bit lines associated with the second set of memory cells.

Example 7 is the circuit of any of Examples 1-6, wherein, to sequentially read the data from the set of memory cells, the memory controller is to read one memory cell per clock phase, and wherein the single assertion of the word line signal has a duration longer than one clock phase.

Example 8 is the circuit of any of Examples 1-7, wherein, to write data to the set of memory cells, the memory controller is to: precharge bit lines associated with the set of memory cells; assert, after the precharge, the word line signal for a time period; and write data sequentially to the set of memory cells during the time period.

Example 9 is the circuit of Example 8, wherein the set of memory cells is a first set of memory cells, wherein the memory circuit further includes a second set of memory cells that are coupled to a different bit line precharge line than the first set of memory cells, and wherein the memory circuit is to: precharge bit lines associated with the second set of memory cells while data from the first set of memory cells is being read; and write data to the second set of memory cells after the precharge of the bit lines associated with the second set of memory cells.

Example 10 is the circuit of Example 8 or 9, further comprising an interruptable diode-connected transistor coupled to the bit lines, wherein the diode-connected transistor is to be selectively coupled between the first bit line and a power rail while one or more other memory cells associated with other bit lines are written, and is to be uncoupled while a first memory cell associated with the first bit line is written.

Example 11 is the circuit of any of Examples 1-10, wherein the set of memory cells includes four memory cells.

Example 12 is a circuit comprising: a memory circuit and a memory controller. The memory circuit includes a set of memory cells coupled to respective bit lines and a same word line, wherein the bit lines are coupled to a same bit line precharge line. The memory controller is to: precharge the bit lines using the bit line precharge line; assert, after the precharge, a word line signal on the word line for a time period; and write data sequentially to the set of memory cells during the time period.

Example 13 is the circuit of Example 12, wherein, to write the data sequentially to the set of memory cells, the memory controller is to sequentially assert respective write column select signals while the word line signal remains asserted.

Example 14 is the circuit of Example 12 or 13, further comprising an interruptable diode-connected transistor coupled to the bit lines, wherein the diode-connected transistor is to be selectively coupled between the first bit line and a power rail while one or more other memory cells associated with other bit lines are written, and is to be uncoupled while a first memory cell associated with the first bit line is written.

Example 15 is the circuit of any of Examples 12-14, wherein the set of memory cells includes four memory cells.

Example 16 is the circuit of any of Examples 12-15, wherein the set of memory cells is a first set of memory cells, wherein the memory circuit further includes a second set of memory cells that are coupled to a different bit line precharge line than the first set of memory cells, and wherein the memory circuit is to: precharge bit lines associated with the second set of memory cells while data from the first set of memory cells is being read; and write data to the second set of memory cells after the precharge of the bit lines associated with the second set of memory cells.

Example 17 is one or more non-transitory, computer-readable media having instructions, stored thereon, that when executed cause a memory controller to: precharge bit lines associated with respective memory cells of a set of memory cells that are multiplexed with a sense amplifier; provide a single assertion of a word line signal to the set of memory cells; and consecutively read data from the set of memory cells based on the precharge and the single assertion of the word line signal.

Example 18 is the one or more media of Example 17, wherein, to consecutively read the data from the set of memory cells, the instructions, are to cause the memory controller to: assert a first read column select signal associated with a first memory cell of the set of memory cells; enable, responsive to de-assertion of the first read column select signal, the sense amplifier to read a first data bit stored by the first memory cell; and precharge, responsive to disablement of the sense amplifier, the sense amplifier to prepare the sense amplifier to read a second data bit stored by a second memory cell of the set of memory cells.

Example 19 is the one or more media of Example 18, wherein a combined duration of the assertion of the first read column select signal, the enablement of the sense amplifier, and the precharge of the sense amplifier is one phase of a clock signal associated with the memory circuit.

Example 20 is the one or more media of Example 18 or 19, wherein the set of memory cells is a first set of memory cells, and wherein the instructions, when executed, are further to cause the memory controller to: precharge bit lines associated with a second set of memory cells while data from the first set of memory cells is being read, wherein the second set of memory cells are multiplexed with the sense amplifier, wherein the second set of memory cells are coupled to a different bit line precharge line than the first set of memory cells; and read data from the second set of memory cells after the precharge of the bit lines associated with the second set of memory cells.

Example 21 is the one or more media of any of Examples 17-20, wherein, to consecutively read the data from the set of memory cells, the memory controller is to read one memory cell per clock phase, and wherein the single assertion of the word line signal has a duration longer than one clock phase.

Example 22 is the one or more media of any of Examples 17-21, wherein, the instructions, when executed, are further to cause the memory controller to, to write data to the set of memory cells: precharge bit lines associated with the set of memory cells; assert, after the precharge, the word line signal for a time period; and write data consecutively to the set of memory cells during the time period.

Although certain embodiments have been illustrated and described herein for purposes of description, this application is intended to cover any adaptations or variations of the embodiments discussed herein. Therefore, it is manifestly intended that embodiments described herein be limited only by the claims.

Where the disclosure recites "a" or "a first" element or the equivalent thereof, such disclosure includes one or more such elements, neither requiring nor excluding two or more such elements. Further, ordinal indicators (e.g., first, second, or third) for identified elements are used to distinguish between the elements, and do not indicate or imply a required or limited number of such elements, nor do they indicate a particular position or order of such elements unless otherwise specifically stated.

What is claimed is:

1. A circuit comprising:
   a memory circuit including a set of memory cells multiplexed with a sense amplifier, the set of memory cells coupled to a same word line; and
   a memory controller to:
      provide a single assertion of a word line signal on the word line to select the set of memory cells for a multi-read operation; and
      sequentially read data from the set of memory cells, using the sense amplifier, based on the single assertion of the word line signal.

2. The circuit of claim 1, wherein the memory controller is further to precharge bit lines associated with respective memory cells of the set of memory cells prior to the single assertion of the word line signal.

3. The circuit of claim 1, wherein, to sequentially read the data from the set of memory cells, the memory controller is to:
   assert a first read column select signal associated with a first memory cell of the set of memory cells;
   enable, responsive to de-assertion of the first read column select signal, the sense amplifier to read a first data bit stored by the first memory cell; and precharge, responsive to disablement of the sense amplifier, the sense amplifier to prepare the sense amplifier to read a second data bit stored by a second memory cell of the set of memory cells.

4. The circuit of claim 3, wherein the memory controller is to assert a sense amplifier precharge signal to precharge the sense amplifier, and wherein the memory controller is further to assert a second read column select signal associated with the second memory cell when the precharge signal is de-asserted.

5. The circuit of claim 3, wherein a combined duration of the assertion of the first read column select signal, the enablement of the sense amplifier, and the precharge of the sense amplifier is one phase of a clock signal associated with the memory circuit.

6. The circuit of claim 3, wherein the set of memory cells is a first set of memory cells, wherein the memory circuit further includes a second set of memory cells that are multiplexed with the sense amplifier, wherein the second set of memory cells are coupled to a different bit line precharge line than the first set of memory cells, and wherein the memory circuit is to:
precharge bit lines associated with the second set of memory cells while data from the first set of memory cells is being read; and
read data from the second set of memory cells after the precharge of the bit lines associated with the second set of memory cells.

7. The circuit of claim 1, wherein, to sequentially read the data from the set of memory cells, the memory controller is to read one memory cell per clock phase, and wherein the single assertion of the word line signal has a duration longer than one clock phase.

8. The circuit of claim 1, wherein, to write data to the set of memory cells, the memory controller is to:
precharge bit lines associated with the set of memory cells;
assert, after the precharge, the word line signal for a time period; and
write data sequentially to the set of memory cells during the time period.

9. The circuit of claim 8, wherein the set of memory cells is a first set of memory cells, wherein the memory circuit further includes a second set of memory cells that are coupled to a different bit line precharge line than the first set of memory cells, and wherein the memory circuit is to:
precharge bit lines associated with the second set of memory cells while data from the first set of memory cells is being read; and
write data to the second set of memory cells after the precharge of the bit lines associated with the second set of memory cells.

10. The circuit of claim 8, further comprising an interruptable diode-connected transistor coupled to a first bit line of the bit lines, wherein the diode-connected transistor is to be selectively coupled between the first bit line and a power rail while one or more other memory cells associated with other bit lines are written, and is to be uncoupled while a first memory cell associated with the first bit line is written.

11. The circuit of claim 1, wherein the set of memory cells includes four memory cells.

12. A circuit comprising:
a memory circuit including a set of memory cells coupled to respective bit lines and a same word line, wherein the bit lines are coupled to a same bit line precharge line; and
a memory controller to:
precharge the bit lines using the bit line precharge line;
assert, after the precharge, a word line signal on the word line for a time period; and
write data sequentially to the set of memory cells during the time period.

13. The circuit of claim 12, wherein, to write the data sequentially to the set of memory cells, the memory controller is to sequentially assert respective write column select signals while the word line signal remains asserted.

14. The circuit of claim 12, further comprising an interruptable diode-connected transistor coupled to the bit lines, wherein the diode-connected transistor is to be selectively coupled between a first bit line, of the bit lines, and a power rail while one or more other memory cells associated with other bit lines are written, and is to be uncoupled while a first memory cell associated with the first bit line is written.

15. The circuit of claim 12, wherein the set of memory cells includes four memory cells.

16. The circuit of claim 12, wherein the set of memory cells is a first set of memory cells, wherein the memory circuit further includes a second set of memory cells that are coupled to a different bit line precharge line than the first set of memory cells, and wherein the memory circuit is to:
precharge bit lines associated with the second set of memory cells while data from the first set of memory cells is being read; and
write data to the second set of memory cells after the precharge of the bit lines associated with the second set of memory cells.

17. One or more non-transitory, computer-readable media having instructions, stored thereon, that when executed cause a memory controller to:
precharge bit lines associated with respective memory cells of a set of memory cells that are multiplexed with a sense amplifier;
provide a single assertion of a word line signal to the set of memory cells; and
consecutively read data from the set of memory cells based on the precharge and the single assertion of the word line signal.

18. The one or more media of claim 17, wherein, to consecutively read the data from the set of memory cells, the instructions are to cause the memory controller to:
assert a first read column select signal associated with a first memory cell of the set of memory cells;
enable, responsive to de-assertion of the first read column select signal, the sense amplifier to read a first data bit stored by the first memory cell; and
precharge, responsive to disablement of the sense amplifier, the sense amplifier to prepare the sense amplifier to read a second data bit stored by a second memory cell of the set of memory cells.

19. The one or more media of claim 18, wherein a combined duration of the assertion of the first read column select signal, the enablement of the sense amplifier, and the precharge of the sense amplifier is one phase of a clock signal associated with the memory controller.

20. The one or more media of claim 18, wherein the set of memory cells is a first set of memory cells, and wherein the instructions, when executed, are further to cause the memory controller to:
precharge bit lines associated with a second set of memory cells while data from the first set of memory cells is being read, wherein the second set of memory cells are multiplexed with the sense amplifier, wherein the second set of memory cells are coupled to a different bit line precharge line than the first set of memory cells; and read data from the second set of memory cells after the precharge of the bit lines associated with the second set of memory cells.

21. The one or more media of claim 17, wherein, to consecutively read the data from the set of memory cells, the memory controller is to read one memory cell per clock phase, and wherein the single assertion of the word line signal has a duration longer than one clock phase.

22. The one or more media of claim 17, wherein, the instructions, when executed, are further to cause the memory controller to write data to the set of memory cells:

precharge bit lines associated with the set of memory cells;

assert, after the precharge, the word line signal for a time period; and write data consecutively to the set of memory cells during the time period.

* * * * *